(12) United States Patent
White et al.

(10) Patent No.: US 9,397,598 B2
(45) Date of Patent: *Jul. 19, 2016

(54) POWER SYSTEM THAT OPERATES IN AN EXERCISE MODE BASED ON MEASURED PARAMETERS

(71) Applicant: Kohler Co., Kohler, WI (US)

(72) Inventors: Timothy W. White, Kohler, WI (US); Robert J. Danforth, III, Sheboygan Falls, WI (US); Jeffrey J. Neis, Sheboygan, WI (US)

(73) Assignee: Kohler Co., Kohler, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/804,056

(22) Filed: Jul. 20, 2015

(65) Prior Publication Data

US 2015/0326159 A1 Nov. 12, 2015

Related U.S. Application Data

(63) Continuation of application No. 13/739,374, filed on Jan. 11, 2013, now Pat. No. 9,109,565.

(51) Int. Cl.
| | |
|---|---|
| *H02K 5/00* | (2006.01) |
| *H02P 9/00* | (2006.01) |
| *F02N 11/08* | (2006.01) |
| *F02D 41/22* | (2006.01) |
| *F02D 29/06* | (2006.01) |

(52) U.S. Cl.
CPC ............ *H02P 9/008* (2013.01); *F02N 11/0803* (2013.01); *F02D 29/06* (2013.01); *F02D 41/22* (2013.01)

(58) Field of Classification Search
USPC ................................................. 290/1 A, 40 R
See application file for complete search history.

(56) References Cited

U.S. PATENT DOCUMENTS

| | | | |
|---|---|---|---|
| 2,748,759 A | 6/1956 | Schiffer |
| 4,282,747 A | 8/1981 | Holzinger |
| 4,307,690 A | 12/1981 | Rau et al. |
| 4,421,075 A | 12/1983 | Mandel |
| 4,423,336 A | 12/1983 | Iverson et al. |
| 4,878,465 A | 11/1989 | Hanson et al. |
| 4,883,034 A | 11/1989 | Yashiki et al. |
| 4,951,627 A | 8/1990 | Watanabe et al. |
| 5,072,703 A | 12/1991 | Sutton |

(Continued)

FOREIGN PATENT DOCUMENTS

| | | |
|---|---|---|
| CN | 101902194 | 12/2010 |
| JP | 2011-035952 A | 2/2011 |

OTHER PUBLICATIONS

"U.S. Appl. No. 13/455,466, Final Office Action mailed Mar. 26, 2015", 12 pgs.

(Continued)

*Primary Examiner* — Tho D Ta
(74) *Attorney, Agent, or Firm* — Schwegman, Lundberg & Woessner, P.A.

(57) ABSTRACT

A power system may include a power generation component and a sensor configured to measure a parameter. The power system may also include a controller in communication with the power generation component and the sensor. The controller may be configured to run the power generation component in an exercise mode for a duration. The duration may be based on the measured parameter.

20 Claims, 9 Drawing Sheets

(56) References Cited

U.S. PATENT DOCUMENTS

| | | | |
|---|---|---|---|
| 5,256,959 | A | 10/1993 | Nagano et al. |
| 5,320,077 | A | 6/1994 | Kamiya et al. |
| 5,504,417 | A | 4/1996 | Kern et al. |
| 5,539,258 | A | 7/1996 | Sutton et al. |
| 5,703,410 | A | 12/1997 | Maekawa |
| 5,712,786 | A | 1/1998 | Ueda |
| 5,784,878 | A | 7/1998 | Kato et al. |
| 5,973,481 | A | 10/1999 | Thompson et al. |
| 5,998,880 | A | 12/1999 | Kumar |
| 6,172,432 | B1 | 1/2001 | Schnackenberg et al. |
| 6,198,256 | B1 | 3/2001 | Miyazaki et al. |
| 6,578,548 | B2 | 6/2003 | Kohn et al. |
| 6,585,938 | B1 | 7/2003 | Machida et al. |
| 6,624,528 | B2 | 9/2003 | Shimizu et al. |
| 6,657,416 | B2 | 12/2003 | Kern et al. |
| 6,707,169 | B2 | 3/2004 | Shimizu et al. |
| 6,740,986 | B2 | 5/2004 | Shimizu et al. |
| 6,791,208 | B2 | 9/2004 | Pfeiffer |
| 6,840,203 | B2 | 1/2005 | Wakitani et al. |
| 6,853,954 | B2 | 2/2005 | Apostolides |
| 6,930,469 | B2 | 8/2005 | Krieger et al. |
| 7,165,530 | B2 | 1/2007 | Jensen et al. |
| 7,230,345 | B2 | 6/2007 | Winnie et al. |
| 7,240,481 | B2 | 7/2007 | Ament |
| 7,646,178 | B1 | 1/2010 | Fradella |
| 8,965,734 | B2 | 2/2015 | Albsmeier et al. |
| 9,109,565 | B2 * | 8/2015 | White ............... F02N 11/0803 290/1 A |
| 2001/0049579 | A1 | 12/2001 | Fujino et al. |
| 2002/0026417 | A1 | 2/2002 | Murata et al. |
| 2005/0278075 | A1 | 12/2005 | Rasmussen et al. |
| 2006/0152189 | A1 | 7/2006 | Ambrosio et al. |
| 2006/0152198 | A1 | 7/2006 | Winnie et al. |
| 2009/0240377 | A1 | 9/2009 | Batzler et al. |
| 2009/0287739 | A1 | 11/2009 | Zhang et al. |
| 2010/0038966 | A1 | 2/2010 | Espeut, Jr. |
| 2011/0172966 | A1 | 7/2011 | Albsmeier et al. |
| 2012/0001597 | A1 | 1/2012 | Gokan et al. |
| 2012/0053884 | A1 | 3/2012 | Batzler et al. |
| 2012/0083927 | A1 | 4/2012 | Nakamura et al. |
| 2013/0285623 | A1 | 10/2013 | Greenwald et al. |
| 2014/0197644 | A1 | 7/2014 | White et al. |

OTHER PUBLICATIONS

"U.S. Appl. No. 13/455,466, Non Final Office Action mailed Sep. 12, 2014", 9 pgs.

"U.S. Appl. No. 13/455,466, Response filed Dec. 4, 2014 to Non Final Office Action mailed Sep. 12, 2014", 11 pgs.

"U.S. Appl. No. 13/739,374, Non Final Office Action mailed Mar. 5, 2015", 11 pgs.

"U.S. Appl. No. 13/739,374, Notice of Allowance mailed May 5, 2015", 10 pgs.

"U.S. Appl. No. 13/739,374, Response filed Mar. 18, 2015 to Non Final Office Action mailed Mar. 5, 2015", 11 pgs.

"Diagnostic Repair Manual: Prepackaged Home Standby Generators", Manual Part No. 83045, Generac Power Systems, Inc. aka Generac Corporation, Waukesha, Wisconsin [downloaded Jan. 22, 2013 at http://www.zabatt.com/generators/productmanuals/083045.pdf], (Sep. 20, 1994), 230 pgs.

"European Application Serial No. 13001988.8, European Search Report mailed Aug. 12, 2013", 5 pgs.

"European Application Serial No. 13001988.8, Response filed Apr. 24, 2014 to European Search Report mailed Aug. 12, 2013", 11 pgs.

"Installation and Owner's Manual: Air-cooled, Prepackaged Automatic Standby Generators", Generac Power Systems, Whitewater, Wisconsin; downloaded from www.Manualslib.com, (Apr. 3, 2002), 44 pgs.

"Joint Departments of the Army and the Navy TM 5-685/NAVFAC MO-912, Operation Maintenance and Repair of Auxiliary Generators, Aug. 26, 1996", 123 pgs.

"NFPA110: Standard for Emergency and Standby Power Systems (2013 Edition)", National Fire Protection Association, Quincy, Massachusetts, (Aug. 2012), 45 pgs.

"Operations Guide LI111: Electro GenConnect(TM) Automatic Start", Electro Industries, Inc., Monticello, Minnesota; www.electromn.com, (Jul. 19, 2000), 12 pgs.

"Operator's Manual 960-0153C: PowerCommand Control Generator Sets", Operator's Manual; Cummins Onan Corporation, (2000), 56 pgs.

"Owner's Manual A7218: Generac Sound Attenuated Emergency Power Systems", Generac Power Systems, Inc., (Nov. 11, 1998), 40 pgs.

"PER: Precise Engine Repair—Air Cooled Generators", Copyright 1999-2012 Precise Engine Repair, Inc., downloaded http://www.perr.com/gen.html on Jan. 21, 2013, (1999), 5 pgs.

"Product Brochure LEXX0522-03: CTS Series Automatic Transfer Switch", Caterpillar, Engine Division, (May 2003), 12 pgs.

"Product Manual: RV Generator Handbook", Cummins Onan, Minneapolis, Minnesota, (Aug. 2007), 37 pgs.

"Sales Bulletin V100: BeK2-K3 (3-phase A.M.F/A.T.S. controller/Generator controller and monitoring system", Bernini Design srl, (Jun. 2009), 8 pgs.

"Specification Sheet 1534c: Residential standby system (RS12000)", Cummins Onan, Cummins Power Generation, Minneapolis, Minnesota, (Jun. 2009), 5 pgs.

"Specification Sheet LEHF0010-00: Olympian G25LTA: Liquid Cooled Gas Engine Generator Sets", Copyright 2009 Caterpillar; www.CAT-ElectricPower.com, (Apr. 2009), 4 pgs.

"Specification Sheet LEHF0017-00: Olympian G70LG Liquid Cooled Gas Engine Generator Sets", Copyright 2009 Caterpillar; www.CAT-ElectricPower.com, (Apr. 2009), 4 pgs.

"Specification Sheet: LoadTec Permanent Pad-Mounted 250-5000KW Model OSM and OSL Series", LoadTec Load Technology Inc., Las Vegas, Nevada, (2006), 12 pgs.

"Specification Sheet: GEN-XFER Generator Set Controllers", Crompton Instruments, Mississauga, Ontario, Canada [viewed at http://www.crompton-canadaeast.com/Generator%20Set%20Solutions/pdf/xfer.pdf on Jan. 1, 2013], 4 pgs.

"Specification Sheet: Genset Controls—PowerCommand Digital Generator Set Control", Cummins Power Generation, Minneapolis, Minnesota, (2001), 9 pgs.

Loehlein, Timothy A., "Maintenance is one key to diesel generator set reliability", Power Topic 7004; Technical Information from Cummins Power Generation; White Paper by Cummins Power Generation, (2007), 4 pgs.

"U.S. Appl. No. 13/455,466, Examiner Interview Summary mailed Jul. 23, 2015", 4 pgs.

"U.S. Appl. No. 13/455,466, Non Final Office Action mailed Sep. 29, 2015", 19 pgs.

"U.S. Appl. No. 13/455,466, Response filed Jul. 24, 2015 to Final Office Action mailed Mar. 26, 2015", 10 pgs.

"Chinese Application Serial No. 201310130540.7, Office Action mailed Mar. 23, 2015", (w/ English Summary), 12 pgs.

"U.S. Appl. No. 13/455,466, Examiner Interview Summary mailed Dec. 3, 2014", 3 pgs.

"U.S. Appl. No. 13/455,466, Examiner Interview Summary mailed Dec. 16, 2015", 3 pgs.

"U.S. Appl. No. 13/455,466, Response filed Dec. 3, 2015 to Non Final Office Action mailed Sep. 29, 2015", 10 pgs.

"Chinese Application No. 201310130540.7, First Office Action dated Mar. 23, 2015", 12 pgs.

"Chinese Application No. 201310130540.7, Second Office Action dated Nov. 30, 2015", 10 pgs.

* cited by examiner

POWER SYSTEM THAT OPERATES IN AN EXERCISE MODE BASED ON MEASURED PARAMETERS

CLAIM OF PRIORITY

This application claims the benefit of priority of U.S. patent application Ser. No. 13/739,374, entitled "A POWER SYSTEM THAT OPERATES IN AN EXERCISE MODE BASED ON MEASURED PARAMETERS," filed on Jan. 11, 2013, the benefit of priority of which is claimed hereby, and which is incorporated by reference herein in its entirety.

TECHNICAL FIELD

This disclosure generally relates to a power system, and more specifically relates to a power system that operates based on measured parameters.

BACKGROUND

Electronic devices are increasingly used and relied for performing countless tasks in all areas of life. Many important electronic devices need continuous power to ensure constant and uninterrupted operation.

Often, the power necessary for the operation of electrical equipment is supplied by a primary power source, such as a utility company. However, power from the primary power source may occasionally be interrupted, such as during inclement weather. Additionally, in some instances, an electronic device may require more power than a primary power supplier may typically provide. In still other instances, electronic devices may be operated where no primary power source is available.

Secondary power sources, such as generators, may be used to satisfy the power needs of electronic devices where primary power is unavailable or insufficient. The secondary power sources may be designed to supply power to the electronic equipment during certain time periods, such as when the primary power source cannot supply the primary power, or when additional power is needed to supplement the power from a primary power source. As such, it may be desirable to operate the secondary power source at various times, to ensure that the secondary power source is operating properly and can provide secondary power when needed or desired.

BRIEF DESCRIPTION OF THE DRAWINGS

The innovation may be better understood with reference to the following drawings and description. In the figures, like reference numerals designate corresponding parts throughout the different views.

DETAILED DESCRIPTION

Figure 1:
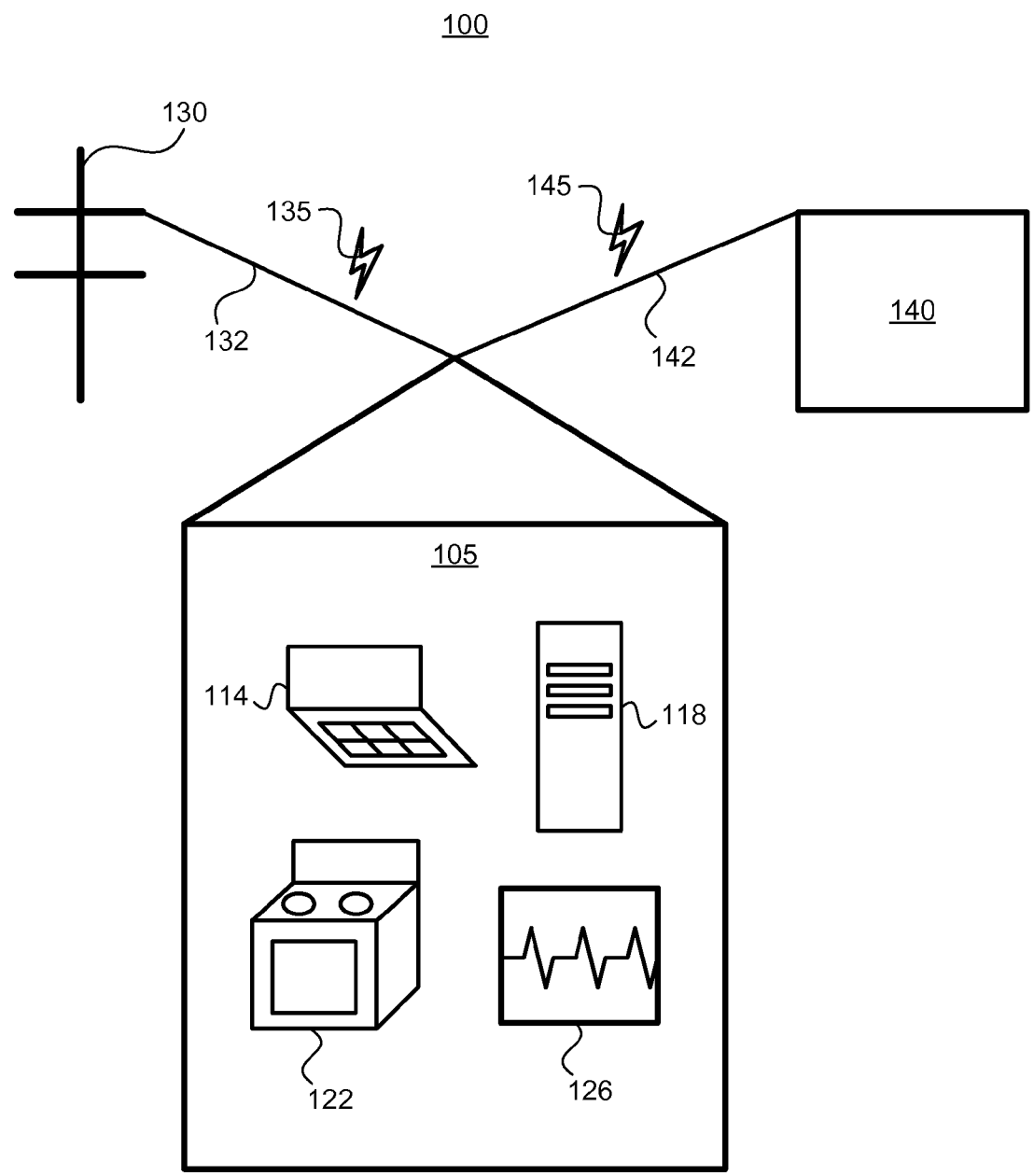
FIG. 1 is an example of a power delivery environment.

FIG. 1 is an example of a power delivery environment 100 that includes a receiving station 105. The receiving station 105 may be any device, unit, building, grid, or combination that may receive power. The receiving station 105 may use some or all of the received power, may distribute some or all of the received power to other power-consuming devices, or both. For example, the receiving station 105 may be a building, or a circuit breaker within the building, which may be configured to receive and distribute power to one or more power-consuming devices within or around the building. Examples of power-consuming devices which the receiving station 105 may distribute received power to may include a computer 114, a server 118, a household appliance 122, a medical instrument 126, personal entertainment devices, appliances, industrial or manufacturing machinery, lighting units, or virtually any other electronic devices configured to receive and use power.

The receiving station 105 may communicate with and receive power from one or more sources. For example, the receiving station 105 may receive primary power 135 from a primary power source 130. The primary power source 130 may be a utility or power company, a generator or set of generators, another source of primary power, or any combination. The primary power 135 may be voltage, alternating current, direct current, voltage, or various other forms of power. The primary power source 130 may provide primary power 135 to the receiving station 105 through a primary power connection 132, such as a power line, wiring, or other power delivery component.

Additionally or alternatively, the receiving station 105 may receive secondary power 145 from a secondary power source 140 (also referred to as a "power system"). The secondary power source 140 may be a generator, a set of generators, battery, another back-up or supplemental power source, or any combination. The secondary power 145 may be alternating current, direct current, voltage, or various other forms of power. The secondary power source 140 may provide secondary power to the receiving station 105 through a secondary power connection 142, such as a power line, wiring, or other power delivery component. In some systems, the receiving station 105 may include a transfer switch that may control what source provides power to the receiving station 105. In some systems, the receiving station 105 may be, or may be connected with, a load that the primary power source 130 or the secondary power source 140 may provide power to.

The secondary power source 140 may operate in a normal mode to provide power to the receiving station 105 at various times or when various conditions exist. For example, the secondary power source 140 may operate in a normal mode and provide secondary power 145 to the receiving station 105 when the primary power source 130 is not available to provide the primary power 135 to the receiving station 105, or when the primary power 135 is insufficient to meet the power needs of the receiving station 105. In other situations, the secondary power source 140 may operate in the normal mode to provide secondary power 145 to the receiving station 105 at various other times.

The secondary power source 140 may also operate in an exercise mode at various times. The exercise mode may represent a mode the secondary power source 140 operates in when the receiving station 105 does not need any secondary power 145. The exercise mode may represent a mode the secondary power source 140 operates in when the secondary power source 140 is not supplying secondary power 145 to the receiving station. The exercise mode may represent a mode the secondary power source 140 operates in when the secondary power source 140 or components of the secondary power source 140 are being tested for proper operation. For example, the secondary power source 140 may run in the exercise mode to ensure that power generation components of the secondary power source 140 work properly and are not defective. Additionally or alternatively, the secondary power source 140 may run in the exercise mode to provide a normal and regular use of the components of the secondary power source 140, which may be helpful in ensuring reliability of the components. The secondary power source 140 may or may not generate any power, or any substantial power, when operating in the exercise mode.

The operation of the secondary power source 140 in the exercise mode may be different from, similar to, or the same as operation of the secondary power source 140 in the normal mode. In some systems, most or all components of the secondary power source 140 may be run as in the normal mode. In some systems, one or more components of the secondary power source 140 may not be operated in the exercise mode. For example, an engine of the secondary power source 140 may be operated in the exercise mode, while an alternator of the secondary power source 140 may not be excited. In other examples, the engine may not be operated, or the alternator may be excited during the exercise mode. Other variations and examples of components operated during the exercise mode are possible.

Figure 2:
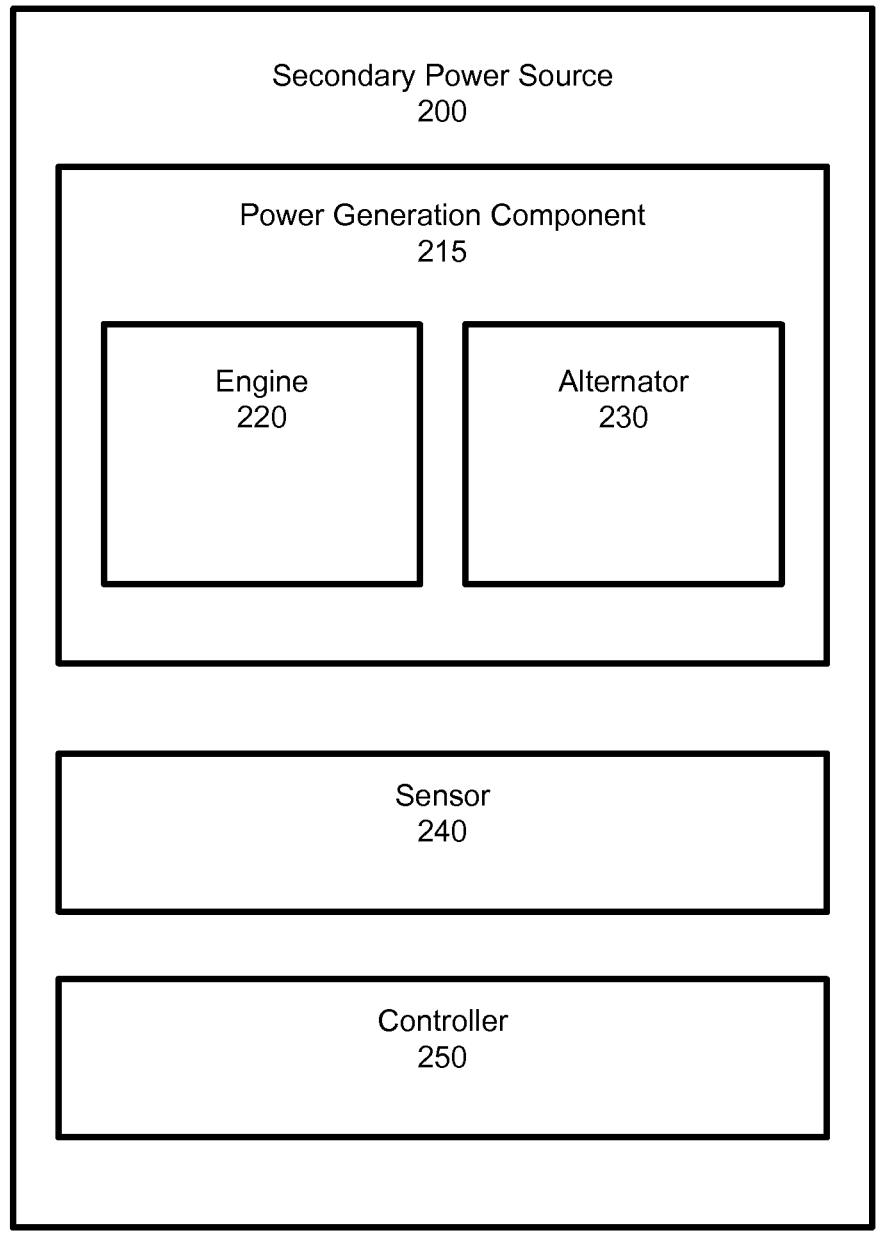
FIG. 2 is an example of a secondary power source for providing power to a receiving station.

FIG. 2 shows an example of a secondary power source 200, which may be similar to or the same as the secondary power source 140. The secondary power source 200 may include a power generation component 215, a sensor 240 and a controller 250. The secondary power source 200 may be configured to smartly operate in the exercise mode. For example, the controller 250 may run the power generation component 215 in the exercise mode for a duration (also referred to as a "time duration," "length of time," or "period of time") according to parameters measured by the sensor 240 (also referred to as "parameter information" or "measured parameters").

The power generation component 215 of the secondary power source 200 may include an engine 220. The engine 220 may be an internal combustion engine, an external combustion engine, an electric motor, a pneumatic motor, a hydraulic motor, a steam turbine, or various other engines or motors which may produce mechanical energy. The engine 220 may be powered by a fuel or resource, such as natural gas, diesel fuel, propane, gasoline, or various other fuels.

The power generation component 215 may additionally or alternatively include an alternator 230. The alternator 230 may be an electromechanical device in communication with the engine 220. The alternator 230 may include or use a rotating magnetic field with a stationary armature, a rotating armature with a stationary magnetic field, or a linear alternator.

The power generation component 215 may generate the secondary power 145 for the receiving station 105 using the engine 220, the alternator 230, or both. For example, the engine 220 may produce mechanical energy when operated. The alternator 230 may convert the mechanical energy created by the engine 220 to electrical energy, such as alternating current. The secondary power source 140 may supply the electrical energy from the alternator 230 to the receiving station 105 as the secondary power 145. In other systems, the power generation component 215 may include various other components and may generate electrical energy or secondary power 145 in various other ways.

The controller 250 of the secondary power source 200 may communicate with the power generation component 215. The controller 250 may additionally communicate with the primary power source 130 or a transfer switch of the receiving station 105. The controller 250 may include hardware, software, firmware, or a combination. The controller 250 may include or access logic or instructions stored in a computer readable medium. The controller 250 may include a processor or processing component that may execute the logic or instructions stored in the computer readable medium.

The controller 250 may control an operation of the secondary power source 200, such as when the power generation component 215 is operated or stopped, for how long the power generation component 215 is operated, what components of the power generation component 215 are operated, in what mode the secondary power source 200 is operated, the speed or specifications that components of the secondary power source 200 are operated at, and various other operational specifications. As an example, the controller 250 may determine that the primary power 135 is interrupted or insufficient, and may instruct the power generation component 215 to run in the normal mode in response to the determination. Other examples are possible.

The controller 250 may additionally or alternatively determine specifications for operating the secondary power source 200 in the exercise mode. The controller 250 may additionally or alternatively instruct the secondary power source 200 to operate in the exercise mode according to the determined specifications. For example, the controller 250 may determine and control when the secondary power source 200 should start or stop operating in the exercise mode. The controller 250 may also or alternatively determine and control how long the secondary power source 200 should operate in the exercise mode. As another example, the controller 250 may determine and control a speed or operating level that the secondary power source 200 should operate in during the exercise mode. Other examples are possible.

The controller 250 may communicate with, and use information from, the sensor 240 in determining the specifications for operating the secondary power source 200 in the exercise mode. For example, the controller 250 may receive information from the sensor 240 about one or more parameters of the secondary power source 200, which the controller 250 may use to determine the duration for operating the secondary power source 200 in the exercise mode.

The duration that the controller 250 operates the secondary power source 200 in the exercise mode may correspond to a length of time necessary to achieve the goals of the exercise mode while minimizing resources needed to run the secondary power source 200 and noise produced by secondary power source 200. The controller 250 may, for example, operate the secondary power source 200 for a duration long enough to run or exercise the components of the secondary power source 200 to ensure proper operation when needed. As another example, the controller 250 may operate the secondary power source 200 for a duration long enough to provide a designated amount of use of the power generation component 215 and sufficiently heat the oil used by the power generation component 215 or burn off moisture from the power generation component 215, after which the controller 250 may terminate the exercise mode to limit excess fuel consumption and noise during operation. Other examples are possible.

The sensor 240 may communicate the parameter information to the controller 250 in various ways, such as through a bus, wired communication line, wirelessly, or in various other ways. In some systems, the sensor 240 may be directly coupled to an input of the controller 250. In other systems, the sensor 240 may communicate the measured parameter to the controller 250 indirectly, such as by or through a separate control module, such as an engine control unit. In some of these systems, the separate control module may then communicate the measured parameter information to the controller 250. The controller 250 may then use the parameter information to determine the duration for operating the secondary power source 200 in the exercise mode.

The controller 250 may receive the parameter information from the sensor 240 continuously, periodically, at intervals, upon request, when triggered by an event, randomly, or at various other times. The controller 250 may control the sensor 240 to control power to the sensor 240 or request a measurement or data about a measurement of the parameter. For example, the controller 250 may request and receive parameter information from the sensor 240 prior to or upon initialization of the exercise mode. The controller 250 may additionally or alternatively receive parameter information from the sensor 240 as the secondary power source 200 operates in the exercise mode. Other examples are possible.

Various types of sensors 240 are possible and may be used to measure one or more parameters. As an example, the sensor 240 may be a temperature sensor and may measure a temperature of a component, input, or output of the secondary power source 200. For example, the sensor 240 may be an oil temperature sensor or an oil pan sensor configured to measure a temperature of an oil of the engine 220. The oil temperature sensor may be a surface mount thermocouple sensor. The surface mount thermocouple may be positioned adjacent to or on a surface of an oil pan or oil containment compartment of the secondary power source 200. Other examples of temperature sensors may include a coolant temperature sensor, an exhaust temperature sensor, an engine temperature sensor, an enclosure temperature sensor, an external temperature sensor, or various other temperature sensors.

The sensor 240 may alternatively be a different type of sensor and may measure a parameter other than temperature. For example, the sensor 240 may be an oil pressure sensor and may be configured to measure the oil pressure of the power generation component 215. As another example, the sensor 240 may be a chemical or compositions sensor. The sensor 240 may be a sensor configured to measure a moisture content of the oil of the power generation component 215. The sensor 240 may be a viscosity sensor configured to measure a viscosity of engine oil. In some variations, the sensor 240 may be an ignition switch or an engine kill switch. The sensor 240 may be a mechanical or electrical sensor. In some secondary power sources 200, multiple sensors 240 of different types or measuring different parameters may be used. Various other sensors are possible.

Figure 3:
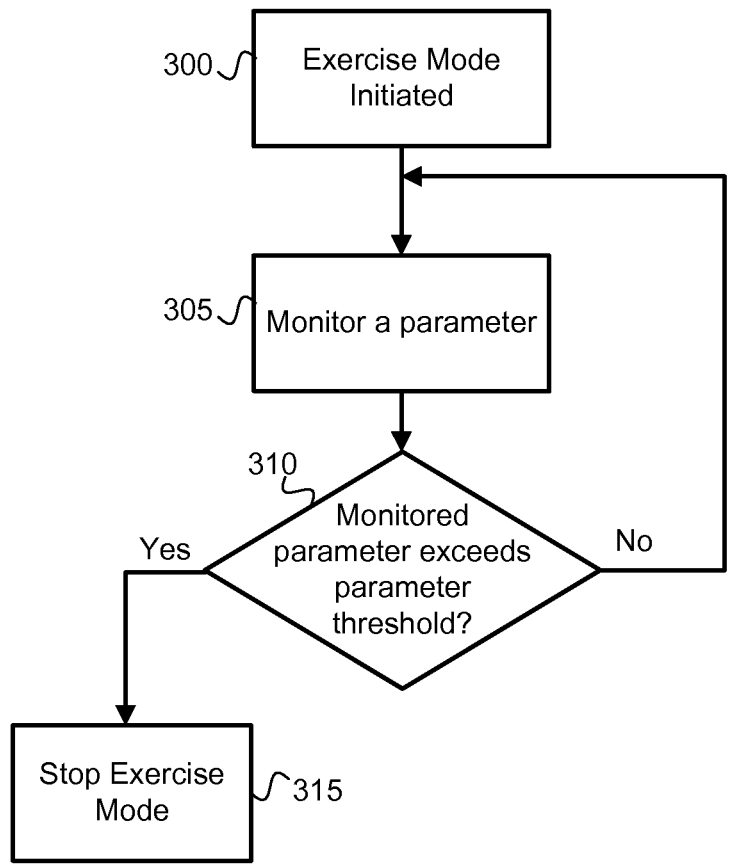
FIG. 3 is an example method for controlling an operation of a secondary power source.

FIG. 3 shows an example of one method to control an operation of the secondary power source 200 in the exercise mode. The method may be performed by the controller 250 or various other components of the secondary power source 200. The method may be implemented as logic, which the controller 250 may execute.

The controller 250 may identify that the exercise mode is or should be initiated (300). The controller 250 may determine, based on calculations, calendar information, user inputs, or some combination, that the secondary power source 200 should be run in the exercise mode. For example, the controller 250 may perform one or more calculations based on a length of time since the secondary power source 200 was last run, a length of time since an exercise mode was last run, a temperature or measured parameter of the secondary power source 200 or various other parameters to determine when to initialize an exercise mode. In some systems, the controller 250 may instruct the secondary power source 200 to begin operation in the exercise mode when it identifies that the exercise mode should be initiated. The determination of whether to initialize an exercise mode (300) may be performed continuously, at intervals, periodically, randomly, when triggered, or at various other times.

The controller 250 or another component of the secondary power source 200 may monitor a parameter (305). For example, the controller 250 may monitor temperature information received from a sensor 240, such as an oil temperature sensor. Additionally or alternatively, the controller 250 may monitor any other parameter information gathered or received from various other sensors 240.

The controller 250 may compare the monitored parameter information with a parameter threshold to determine when the monitored parameter exceeds the parameter threshold (310). The parameter threshold may correspond to a value of the measured parameter that, when reached, would indicate that the exercise mode may be terminated or that the goals of the exercise mode have been achieved. For example, a parameter threshold of an oil temperature may be set at a certain temperature, above which all moisture in the oil should have been burned off. Various other examples are possible. The parameter threshold may be set automatically or by a user.

The controller 250 may perform the comparison continuously, periodically, at intervals, randomly, when triggered, or at various other times. For example, the controller 250 may continuously compare monitored oil temperature to a threshold oil temperature, to determine when the oil has heated up to or past a certain value. Additionally or alternatively, the controller 250 may compare any other parameter information gathered or received with various other parameter threshold.

If the monitored parameter does not exceed the parameter threshold, the secondary power source 200 may continue to operate in the exercise mode and the controller 250 may continue to monitor the parameter (305). If instead the monitored parameter does exceed the parameter threshold, the controller 250 may instruct or control the secondary power source 200 to stop operation in the exercise mode (315). In this way, the controller 250 may operate the secondary power source 200 in an exercise mode until an identified parameter, such as oil temperature, reaches a designated parameter threshold (sometimes referred to as a "closed-loop" operation).

The method of FIG. 3 may include fewer or more blocks. For example, in some variations, the controller 250 may perform blocks 305 and 310 for multiple parameters, and may not stop the exercise mode until more than one or all parameter thresholds are satisfied. Additionally or alternatively, one or more blocks of FIG. 3 may be performed in a different order or simultaneously. For example, in some variations, blocks 305 and 310 may be performed simultaneously, either continuously or at intervals. Other variations are possible.

Figure 4:
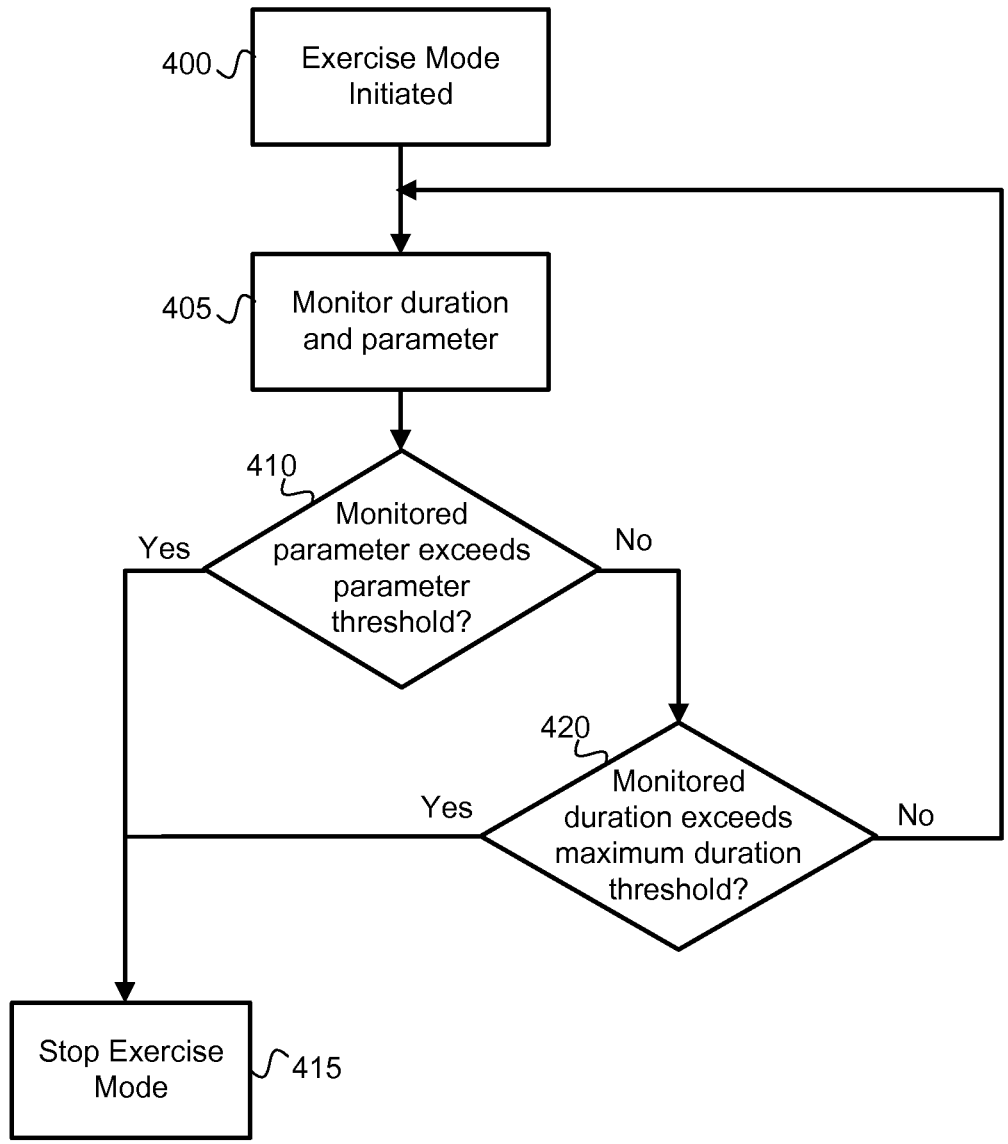
FIG. 4 is an example method for controlling an operation of a secondary power source.

FIG. 4 shows another example of a method to control an operation of the secondary power source 200 in the exercise mode. The method may be performed by the controller 250 or various other components of the secondary power source 200. The method may be implemented as logic, which the controller 250 may execute.

The controller 250 may identify that the exercise mode is or should be initiated (400). The initiation of the exercise mode in block 400 may be the same as, similar to, or otherwise resemble the initiation of the exercise mode in block 300 of the method in FIG. 3.

The controller 250 may then monitor a duration and a parameter (405). For example, the controller 250 may start a clock, timer, or counter when the exercise mode is started, and may monitor the clock, timer, or counter as the secondary power source 200 operates in the exercise mode. The controller 250 may additionally monitor a parameter at block 405. The monitoring of the parameter in block 405 may be the same as, similar to, or otherwise resemble the monitoring in block 305 of the method in FIG. 3.

The controller 250 may compare the monitored parameter information with a parameter threshold to determine when the monitored parameter exceeds the parameter threshold (410). The comparison and determination in block 410 may be the same as, similar to, or otherwise resemble the comparison and determination in block 310 of the method in FIG. 3.

If the monitored parameter exceeds the parameter threshold, the controller 250 may instruct or control the secondary power source 200 to stop operation in the exercise mode (415). The termination of the exercise mode in block 415 may be the same as, similar to, or otherwise resemble the termination of the exercise mode in block 315 of the method in FIG. 3.

If the monitored parameter does not exceed the parameter threshold, the controller 250 may compare the monitored duration to a maximum duration threshold to determine when the monitored parameter exceeds the maximum duration (420). The maximum duration threshold may correspond to a maximum exercise mode duration, after which the controller 250 may terminate the exercise mode even if the parameter threshold has not been met. The maximum duration threshold may be set automatically or by a user. As one example, the maximum duration threshold may be set to 20 minutes, after which the controller 250 may terminate the exercise mode even if the measured parameter does not exceed the parameter threshold.

If the monitored duration does not exceed the maximum duration threshold, the secondary power source 200 may continue to operate in the exercise mode and the controller 250 may continue to monitor the duration and the parameter (405). If instead the duration exceeds the maximum duration threshold, the controller 250 may instruct or control the secondary power source 200 to stop operation in the exercise mode (415). In this way, the controller 250 may operate the secondary power source 200 in an exercise mode until an identified parameter, such as oil temperature, reaches a designated parameter threshold, but not longer than a designated duration signified by the maximum duration threshold. The use of the maximum duration determination in block 420 may protect the system from situations where a faulty sensor provides inaccurate information to the controller 250. The use of the maximum duration determination may also be useful in environments where it may not be possible for the measured parameter to always exceed the parameter threshold value in a reasonable period of time.

The method of FIG. 4 may include fewer or more blocks. Additionally or alternatively, one or more blocks of FIG. 4 may be performed in a different order or simultaneously. For example, in some variations, blocks 410 and 420 may be performed simultaneously or in the opposite order. Other variations are possible.

Figure 5:
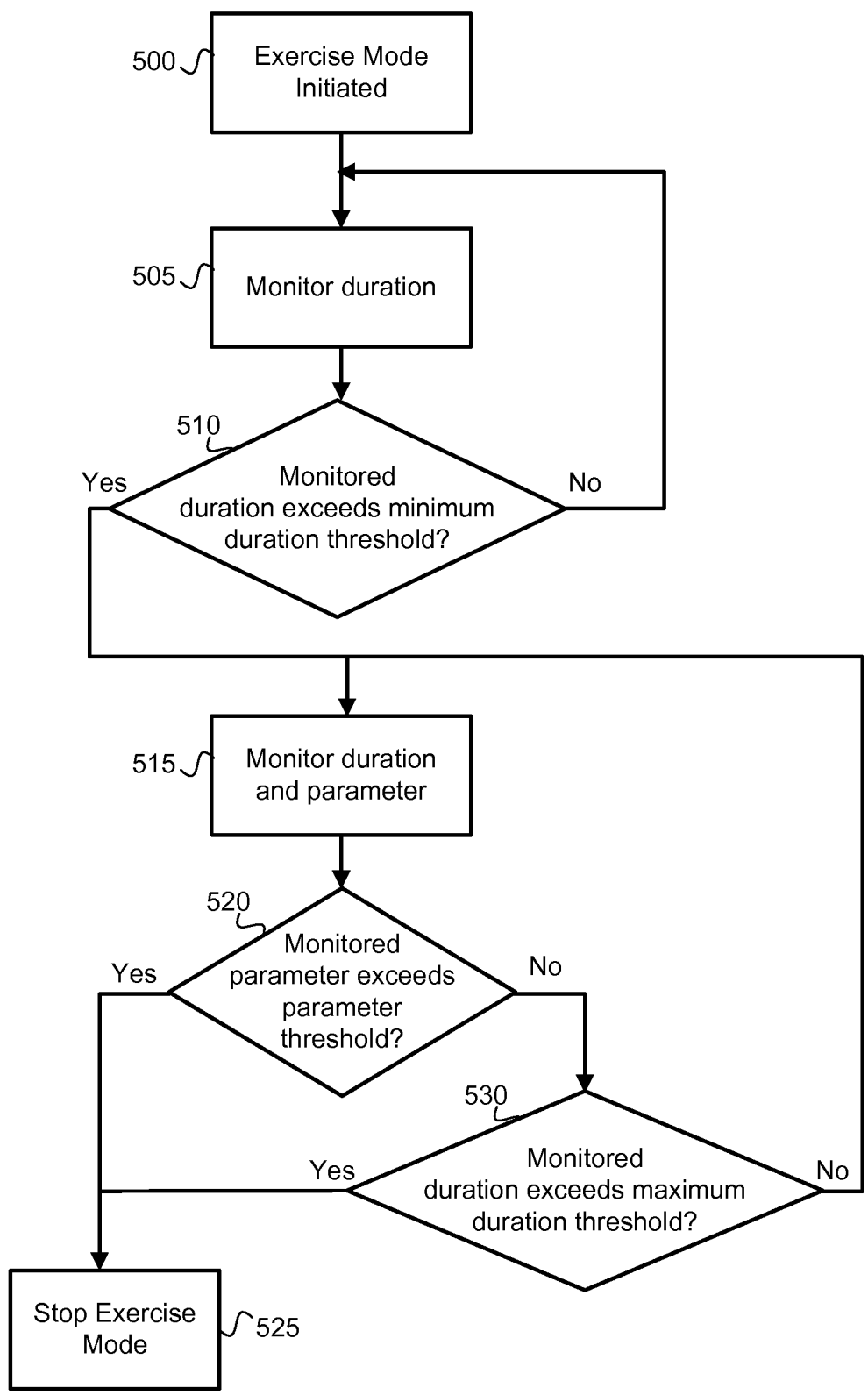
FIG. 5 is an example method for controlling an operation of a secondary power source.

FIG. 5 shows another example of a method of controlling an operation of the secondary power source 200 in the exercise mode. The method may be performed by the controller 250 or various other components of the secondary power source 200. The method may be implemented as logic, which the controller 250 may execute.

The controller 250 may identify that the exercise mode is or should be initiated (400). The initiation of the exercise mode in block 400 may be the same as, similar to, or otherwise resemble the initiation of the exercise mode in blocks 300 or 400 of the methods in FIG. 3 or 4.

The controller 250 may then monitor a duration (505). For example, the controller 250 may start a clock, timer, or counter when the exercise mode is started, and may monitor the clock, timer, or counter as the secondary power source 200 operates in the exercise mode.

The controller 250 may compare the duration with a minimum duration threshold to determine when the initial duration exceeds the minimum duration threshold (510). The minimum duration threshold may correspond to a minimum exercise mode duration, before which the controller 250 may not terminate the exercise mode even if the parameter threshold has been met. As one example, the minimum duration threshold may be set to 3 minutes, before which the controller 250 may not terminate the exercise mode even if the measured parameter exceeds the parameter threshold. The minimum duration threshold may be set automatically or by a user.

If the monitored duration does not exceed the minimum duration threshold, the secondary power source 200 may continue to operate in the exercise mode and the controller 250 may continue to monitor the duration (505). While the controller 250 is monitoring the duration and comparing it to the minimum duration threshold (505, 510), the controller 250 may, in some instances, ignore any parameter information from the sensor 240.

If instead the duration exceeds the minimum duration threshold, the controller may monitor the duration and a parameter (515). The controller 250 may continue to use the clock, timer, or counter, which may continue to run and be used to keep track of the total duration of the exercise mode. In other variations, the controller 250 may start a separate second clock, timer, or counter to measure only the duration since the minimum duration threshold was exceeded. Additionally, the monitoring of the parameter in block 515 may be the same as, similar to, or otherwise resemble the monitoring in blocks 305 and 405 of the methods in FIG. 3 or 4.

The controller 250 may compare the monitored parameter information with a parameter threshold to determine when the monitored parameter exceeds the parameter threshold (520). If the monitored parameter exceeds the parameter threshold, the controller 250 may instruct or control the secondary power source 200 to stop operation in the exercise mode (525). The monitoring and comparisons of blocks 520 and 525 may be the same as, similar to, or otherwise resemble the monitoring and comparisons in blocks 305 and 310 in FIG. 3 or blocks 405 and 410 in FIG. 4.

If the monitored parameter does not exceed the parameter threshold, the controller 250 may compare the monitored duration to a maximum duration threshold to determine when the monitored duration exceeds the maximum duration threshold (530). If the monitored duration does not exceed the maximum duration threshold, the secondary power source 200 may continue to operate in the exercise mode and the controller 250 may continue to monitor the duration and the parameter (515). If instead the duration exceeds the second time threshold, the controller 250 may instruct or control the secondary power source 200 to stop operation in the exercise mode (525).

By implementing the method in FIG. 5, the controller 250 may operate the secondary power source 200 in an exercise mode for at least a minimum period of time, and until an identified parameter, such as oil temperature, reaches a designated parameter threshold, but not longer than a designated duration signified by the time threshold. The use of the first time threshold determination in block 510 may protect the system from situations where a faulty sensor provides inaccurate information to the controller 250, and may also be useful to ensure that the secondary power source 200 is exercised for at least a minimum length of time, regardless of the system parameters.

The method of FIG. 5 may include fewer or more blocks. For example, the controller 250 may alternatively compare a duration to a minimum duration threshold (510), but may not include any subsequent comparison with a maximum duration threshold (530). Additionally or alternatively, one or more blocks of FIG. 5 may be performed in a different order or simultaneously. For example, in some variations, blocks 520 and 530 may be performed simultaneously or in the opposite order. Other variations are possible.

The controller 250 may additionally or alternatively implement other methods to control an operation of the secondary power source 200 in the exercise mode. For example, the controller 250 may control a part of an exercise mode duration, such as a speed at which an engine 220 or the secondary power source 200 operates, based on a measured parameter. Additionally or alternatively, the controller 250 may determine when to enter into a new phase of an exercise mode duration based on a measured parameter.

Figure 6:
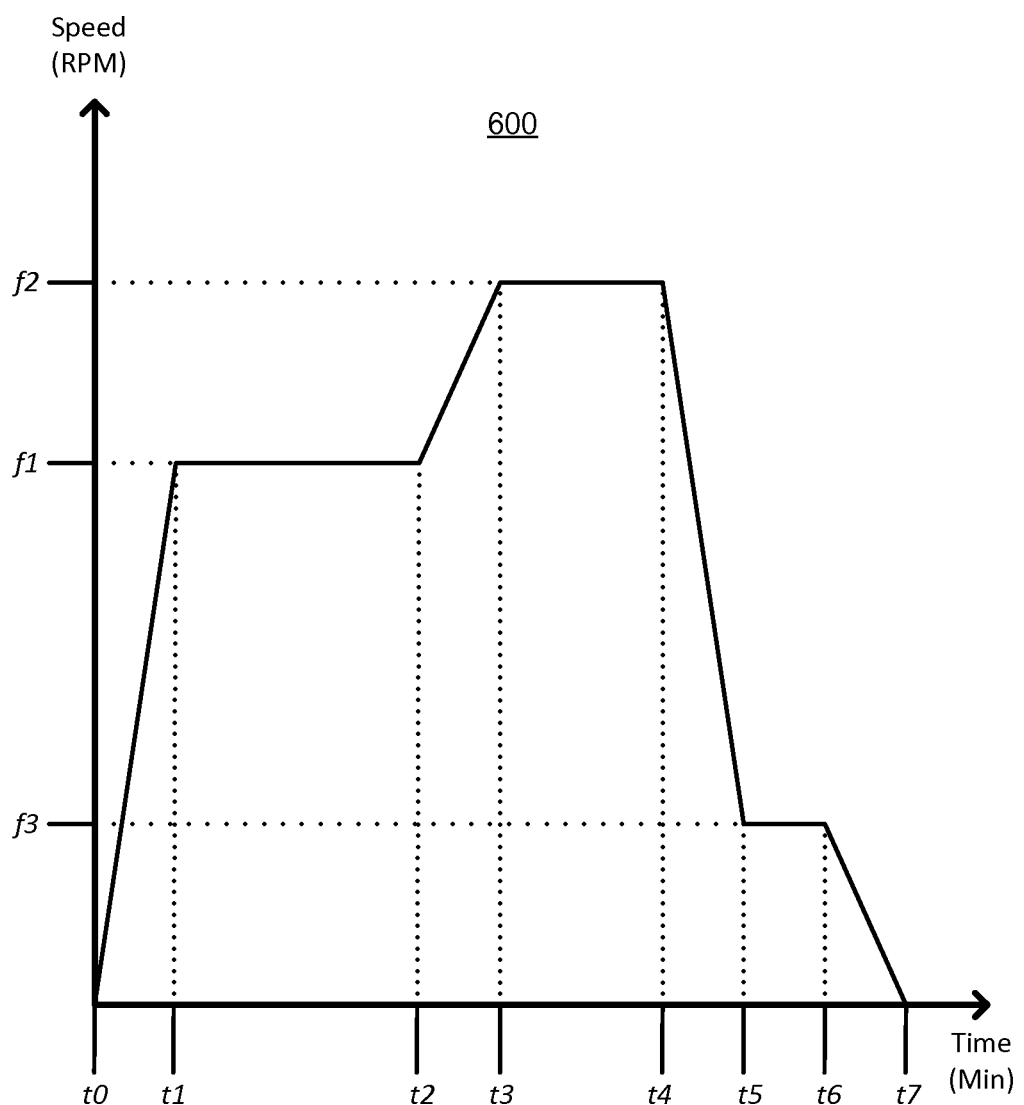
FIG. 6 is an example chart of an operation of a secondary power source.

FIG. 6 shows an example diagram 600 of an operation of the secondary power source where the controller 250 controls the speed of an engine 220 operating during the exercise mode and according to measured parameters. The controller 250 may initially turn on the engine 220 at time t0 when the exercise mode is initiated, and may monitor a parameter such as oil temperature. The controller 250 may run the engine for a first period of time (t1–t0) until the engine 220 reaches a first speed f1.

The first speed f1 may, for example, be a warm up speed or may be less than full speed, such as 2000 revolutions per minute (RPM). The controller 250 may be configured to run the engine 220 at the first speed f1 for a warm up duration, such as for a period of time (t2–t1). The warm up duration may be a set period of time that may not depend on a measured parameter. In other examples, the warm up duration may be determined based on the measured parameter information from the sensor 240.

After the warm-up duration, the controller 250 may instruct the engine 220 to run at a second speed f2. The controller 250 may allow the engine 220 to change the operating speed to the second speed f2 during time period (t3–t2). The second speed f2 may, for example, be a full speed of the engine 220, or another speed. The controller 250 may be configured to run the engine 220 at the second speed f2 for a full speed duration, such as for a period of time (t4–t3). The full speed duration may be a set period of time that may not depend on a measured parameter. In other examples, the full speed duration may be determined based on the measured parameter information from the sensor 240.

After the full speed duration, the controller 250 may instruct the engine 220 to run at a third speed f3. The controller 250 may allow the engine 220 to change the operating speed to the third speed f3 during time period (t5–t4). The third speed f2 may be a cool down speed of the engine 220, or another speed. The controller 250 may monitor the oil temperature and run the engine at the third speed f3 until the oil temperature reaches a temperature threshold. When the oil temperature reaches the temperature threshold at time t6, the controller 250 may determine that the exercise mode may be terminated. As such, the controller 250 may allow the engine 220 to stop during the time period (t7–t6). In other examples, the cool down speed duration may be predetermined and not dependent on any measured parameter information.

In some variations, the controller 250 may use a measured parameter to determine the period of the warm up duration or the full speed duration. For example, the controller 250 may monitor the oil temperature and may stop the full speed at a time t4 when the oil temperature exceeds a threshold. In some variations, the controller 250 may determine whether or not to skip one or more portions of an exercise mode based on a measured parameter. For example, if the oil temperature is above a certain threshold when the exercise mode is initiated, the controller 250 may instruct the engine 220 to immediately ramp up to full speed f2 and not run for any warm up duration. In some variations, the controller 250 may operate the engine 220 at a speed based on the measured parameter. For example, the controller 250 may set the engine warm up speed f1 based on the oil temperature, such that a warmer oil temperature may allow for the engine 220 to be warmed up at a higher or lower speed than a cooler oil temperature. In still other examples, the controller 250 may control other operational specifications in the engine 220 or other secondary power source 200 components based on measured parameter information from the sensor 240.

In addition or alternative to determining during the exercise mode when to transition to a new phase or when to end, the controller 250 may determine and set a duration of an exercise mode when the exercise mode is initiated or started (sometimes referred to as an "open-loop" operation). In some of these systems, the controller 250 may not need to compare a measured parameter to a threshold. For example, the controller 250 may receive parameter information from the sensor 240 upon an initiation or starting of an exercise mode and may calculate and set the duration at the onset of the exercise mode based on the initial parameter information.

Figure 7:
FIG. 7 is an example of a look-up table for determining a duration of an exercise mode.

The controller 250 may determine the duration using a look-up table. FIG. 7 shows an example of a look-up table 700 that the controller 250 may use to determine the duration for operating the secondary power source 200 in the exercise mode. The controller 250 may compare parameter information received from the sensor 240 with the entries in the look-up table 700. The controller 250 may search for the entry of the look-up table 700 that corresponds to the measured parameter, and may identify the duration to operate the secondary power source 200 in the exercise mode as the duration that corresponds to the measured parameter.

As a specific example, when the controller 250 receives parameter information indicating that the temperature measured by the sensor 240 is 50 degrees Fahrenheit, the controller 250 may use the look-up table 700 to determine that the duration for operating the secondary power source 200 in the exercise mode should be 10 minutes. The controller 250 may then instruct the secondary power source 200 to operate in the exercise mode for 10 minutes, after which the controller 250 may turn off or power down the secondary power source 200. Other examples are possible.

The controller 250 may additionally or alternatively perform one or more algorithms using the initial parameter information as an input to determine the duration to operate the secondary power source 200 in the exercise mode. The controller 250 may insert the parameter information received from the sensor 240 into an algorithm, which may output the duration of the exercise mode. Based on the results or outputs of the algorithm, the controller 250 may instruct the power generation component 215 to operate in an exercise mode for the determined duration.

As one example, the algorithm may be the equation (1) below, where Tmp is the temperature measured by the sensor in degrees Fahrenheit, and Dur(min) is the duration of the exercise mode in minutes:

$$Dur(\text{min}) = \begin{cases} 20 & \text{if } Tmp < \text{ or } = 10 \\ 5 + (15 * ((90 - Tmp)/(70 + Tmp)) & \text{if } 0 < Tmp < 90 \\ 5 & \text{if } Tmp > \text{ or } = 90 \end{cases} \quad (1)$$

As a specific example using the equation (1), when the controller 250 receives parameter information indicating that the temperature measured by the sensor 240 is 50 degrees Fahrenheit, the controller 250 may input 50 as the Tmp in the equation (1). The output of the equation (1) may be 10, which may indicate that the duration for operating the secondary power source 200 in the exercise mode should be 10 minutes. The controller 250 may then instruct the secondary power source 200 to operate in the exercise mode for 10 minutes, after which the controller 250 may turn off or power down the secondary power source 200. In other systems, the controller 250 may use parameter information other than temperature information with the look-up table 700 or algorithms to determine the duration. In other systems, the controller 250 may use a combination of a look-up table and an algorithm, or various other methods or systems to determine the duration to operate the secondary power source 200 in the exercise mode, or to determine a duration of a phase of the exercise mode to operate the secondary power source 200 in.

Figure 8:
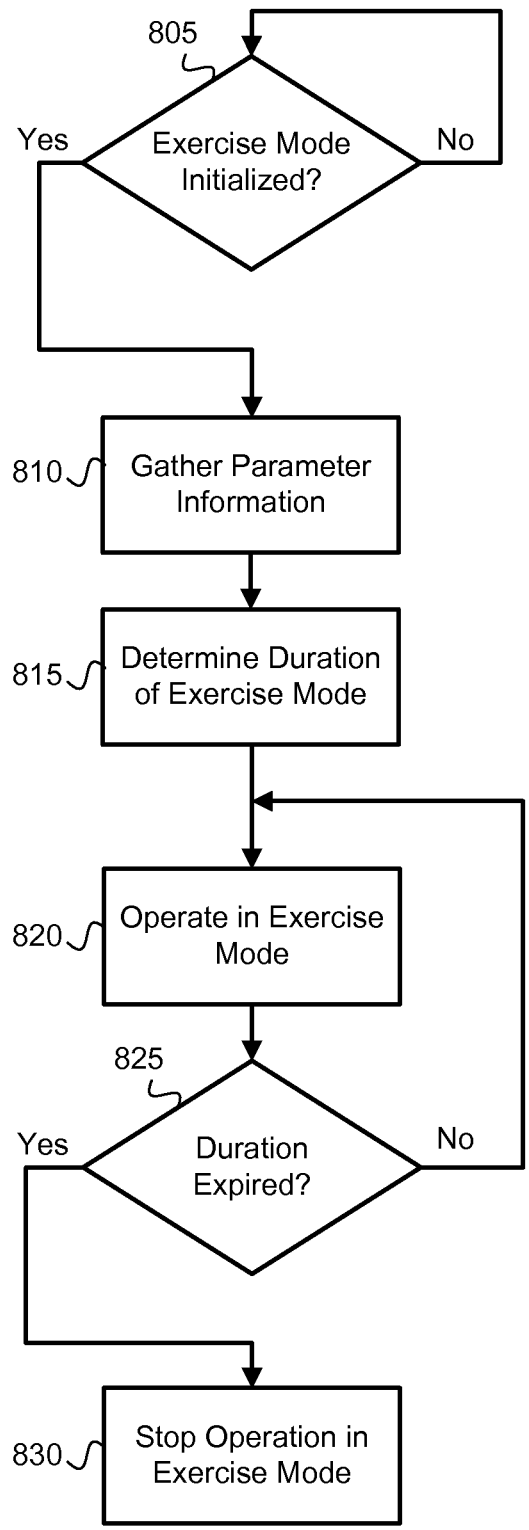
FIG. 8 is an example method for controlling an operation of a secondary power source.

FIG. 8 shows an example method of controlling an operation of a secondary power source 200 in an exercise mode. The method may be performed by the controller 250 or various other components of the secondary power source 200. The method may be implemented as logic, which the controller 250 may perform.

A determination may be made whether to initialize an exercise mode (805). The initiation of the exercise mode in block 805 may be the same as, similar to, or otherwise resemble the initiation of the exercise mode in block 300 of the method in FIG. 3.

When the controller 250 determines that that the exercise mode should be initialized, parameter information may be gathered from the sensor 240 (810). For example, the controller 250 may receive temperature information about the oil of the engine 220 from an oil temperature sensor 240. Other variations are possible.

The controller 250 may determine an exercise mode duration (815). The exercise mode duration may be based on the parameter information received at block 810. The controller 250 may determine the exercise mode duration by using a look-up table, algorithm, or in various other ways.

The secondary power source 200 may run in the exercise mode (820). For example, the controller 250 may instruct the power generation component 215 to begin operation in the exercise mode. Upon receiving instructions from the controller 250, the power generation component 215 may start and run the engine 220. The controller 250 may start a clock, timer, or counter when the secondary power source begins running in the exercise mode.

The controller 250 may identify when the determined duration expires (825). The controller 250, power generation component 215, or another component of the secondary power source 200 may track of the time since the clock, timer, or counter was started. If the duration has not expired, the method may return to (820), and the secondary power source 200 may continue to operate in the exercise mode.

If the duration has expired, the power generation component 215 may stop running in exercise mode (830). In some systems, the power generation mode 215 may determine when to stop running in exercise mode, and may stop itself. Additionally or alternatively, the controller 250 may monitor a time the power generation component 215 has operated in exercise mode, and may determine when the determined duration has expired. Upon expiration, the controller 250 may instruct the power generation component 215 to stop running in exercise mode.

The method of FIG. 8 may include fewer or more blocks. Additionally or alternatively, one or more blocks of FIG. 8 may be performed in a different order or simultaneously. For example, the controller 250 may gather the parameter information before, during, or after instructing the power generation component 215 to being operating in exercise mode. Other variations are possible.

The controller 250 may receive updated parameter information from the sensor 240 as the power generation component 215 operates in the exercise mode, and may set or update the duration of the exercise mode based on the updated parameter information received from the sensor 240. For example, the controller 250 may receive updated parameter information as the secondary power source 200 is operating in the exercise mode, and may refer back to the look-up table 700, the algorithm, or another look-up table or algorithm, to update the exercise mode duration based on the updated parameter information. The controller 250 may instruct the power generation component 215 to operate in the exercise mode for the updated exercise mode duration based on the additional determinations and calculations. Updating the exercise mode duration based on updated parameters may be useful in situations where the measured parameter changes in a way that may not be expected based on normal conditions.

Figure 9:
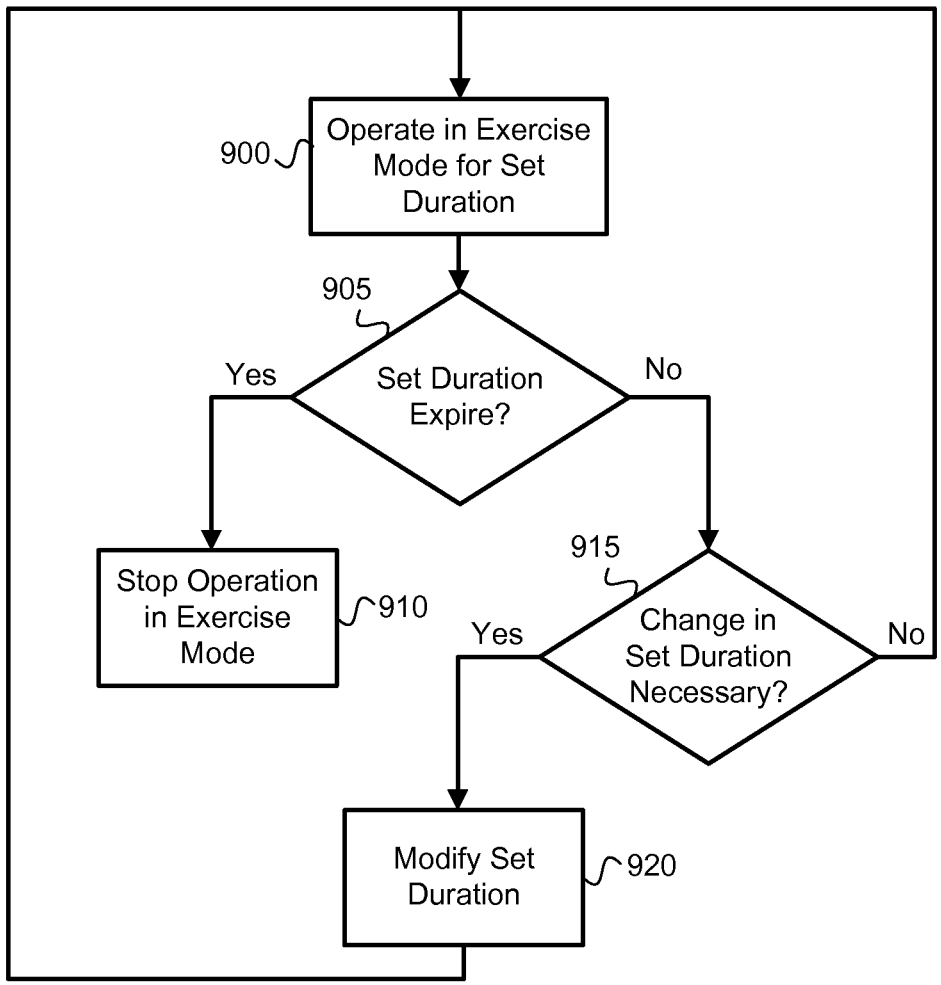
FIG. 9 is an example method for controlling an operation of secondary power source.

FIG. 9 shows an example method of updating an operation of a secondary power source 200 in an exercise mode. The method may be performed by the controller 250 or various other components of the secondary power source 200. The method may be implemented as logic, which the controller 250 may perform.

The secondary power source 200 may be operating in an exercise mode with a set duration (900). The secondary power source 200 may determine whether or not the set duration has expired (905). If the duration has expired, the exercise mode may be stopped (910). Blocks 900, 905, and 910 may be similar to, or the same as, operation in block 820, 825, and 830 of the method in FIG. 8.

If the duration has not expired, the secondary power source 200 may determine whether a change in the duration is necessary (915). For example, the controller 250 may receive updated parameter information from the sensor 240, and may use one or more look-up table or algorithm to determine an updated duration. If the updated duration is different from the remaining set duration, the controller 250 may determine that the set duration may need to be modified. In some instances, the controller 250 may consider any difference between the updated duration and the remaining set duration to be sufficient to initiate a change in the set duration. In other instances, the controller 250 may only consider differences greater than a threshold, or satisfying another criteria, as being sufficient to initiate a change in the set duration.

If no change in the set duration is needed, the secondary power source 200 may continue operating in the exercise mode (900). If instead a change in the set duration is needed, the controller 250 may determine the updated duration and may modify the set duration to correspond to the updated duration (920). The method may return to (900).

The method of FIG. 9 may be utilized to update the duration of the exercise mode during an operation of the secondary power source 200 in the exercise mode. The method of FIG. 9 may be performed continuously, at intervals, when triggered by an event, randomly, or at various other times. One or more blocks of the method of FIG. 9 may be performed in a different order. For example, the controller 250 may determine whether or not the set duration has expired (905) after or concurrently with the determination of whether or not a change in duration is needed (915). Additionally or alternatively, one or more blocks of the method of FIG. 9 may be omitted, new blocks may be added, and one or more blocks may be modified or altered. Other variations are possible.

The thresholds, parameters, tables, and algorithms used in determining the duration of the exercise mode may be set and controlled automatically. Additionally or alternatively, the controller 250 may include an interface through which a user may interact with the secondary power source 200. The controller 250 may be configured to receive inputs from a user through the interface to allow a user to set or modify one or more thresholds, tables, or algorithms. The controller 250 may be configured to receive inputs from a user through the interface to allow the user to determine which parameters may be used to determine a duration of the exercise mode. Other variations are possible.

When the controller 250 determines the specifications for operating the secondary power source 200, such as when or in what manner to run one or more components of the secondary power source 200, the controller 250 may send a signal or instructions to the components to operate according to the determined specification. For example, the controller 250 may send instructions to the power generation component 215 to start when the controller 250 determines that the exercise mode should be initiated. In other examples, the controller 250 may not directly instruct a component to operate according to the determined specifications, but may instead instruct an intermediary component, such as an engine control unit, to operate the desired component (such as the engine 220). In still other examples, the controller 250 may actually operate the desired components themselves according to the determined specifications. Other variations and examples are possible.

The secondary power source 200 may include, or be connected with, a user interface or display. The display may provide a visual or audible indicator to a user based on the sensed parameters. This may be useful where a user wishes to monitor parameters or the status of the exercise mode, or where the user may wish to manually start and stop the secondary power source 200 from operating in the exercise mode. As an example, a user may turn on the secondary power source 200 when a first light on the display is on (or in another state, such as a different color, flashing pattern, or sequence). The user may monitor a light, such as a second light, on the display. The second light may be turned on when the controller determines, based on a sensed parameter, that the exercise mode may be terminated. The second light may remain on until the user turns off the secondary power source 200. In other examples, the display may provide information about the sensed parameter, information about the operation of the secondary power source 200 such as its operating history and its present operating conditions, information about a load, or various other information. Other examples are possible.

The methods, devices, and logic described above may be implemented in many different ways in many different combinations of hardware, software or both hardware and software. For example, all or parts of the secondary power source 200, such as the controller 250, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. A product, such as a computer program product, may include a storage medium and computer readable instructions stored on the medium, which when executed in an endpoint, computer system, or other device, cause the device to perform operations according to any of the description above.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

The methods described may include determinations in relation to one or more thresholds. While these methods may refer to a determination about whether a parameter exceeds a threshold, the determination may in other variations be whether the parameter is greater than or equal to, less than, equal to, or less than or equal to a threshold. Other variations are possible.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A method comprising:
   identifying a parameter;
   determining when the parameter satisfies a condition;
   monitoring a duration of operation of a generator in an exercise mode, the generator not providing power to a load when operating in the exercise mode;
   comparing, using a control system, the duration to a time threshold; and
   stopping the operation of the generator in the exercise mode based on the determination of when the parameter satisfies the condition and the comparison of the duration to the time threshold.

2. The method of claim 1, wherein the time threshold comprises a minimum time threshold; and wherein the stopping the operation of the generator in the exercise mode comprises stopping the generator only after the duration exceeds the minimum time threshold.

3. The method of claim 1, wherein the time threshold comprises a maximum time threshold; and
wherein stopping the operation of the generator in the exercise mode comprises stopping the generator no later than when the duration equals the maximum time threshold.

4. The method of claim 1, wherein identifying the parameter comprises measuring the parameter with a sensor.

5. The method of claim 1, wherein the parameter is an oil temperature.

6. The method of claim 1, wherein the parameter is a moisture content of oil.

7. A method comprising:
identifying a parameter;
determining a duration to operate a power generation component in an exercise mode based on the identified parameter; and
operating the power generation component in the exercise mode for the duration, the power generation component not supplying power to a load when operating in the exercise mode.

8. The method of claim 7, wherein determining the duration occurs before operating the power generation component in the exercise mode.

9. The method of claim 7, wherein the power generation component comprises an engine and an alternator; and
wherein operating the power generation component in the exercise mode comprises running the engine for a first portion of the duration at a first speed, and running the engine for a second portion of the duration at a second speed different than the first speed.

10. The method of claim 7, wherein identifying the parameter comprises identifying initial parameter information; and
the method further comprising identifying additional parameter information after starting the operation of the power generation component.

11. The method of claim 10, wherein the additional parameter information is identified at preset time intervals.

12. The method of claim 10, further comprising adjusting the determined duration based on the additional parameter information.

13. The method of claim 12, wherein the determined duration is adjusted only when the additional parameter information exceeds a threshold parameter change level.

14. A power system, comprising:
a power generation component; and
a control system in communication with the power generation component;
wherein the control system is configured to determine a duration to run the power generation component in an exercise mode where the power generation component is not supplying power, the duration based on an identified generator parameter; and
wherein the control system instructs the power generation component to run in the exercise mode for the duration.

15. The system of claim 14, wherein the control system determines the duration based on a time threshold.

16. The duration of claim 15, wherein the time threshold defines a minimum amount of time that the power generation component is run in the exercise mode.

17. The system of claim 14, wherein the control system communicates changes in the operation of the power generation component to a user.

18. The system of claim 14, wherein the control system is comprised of two or more processors controlling separate components.

19. The system of claim 18, wherein the two or more processors are in wireless communication with one another.

20. The system of claim 14, wherein the duration may be modified after the control system instructs the power generation component to run in the exercise mode for the duration.

* * * * *